(12) United States Patent (10) Patent No.: US 6,323,790 B1
Takehara (45) Date of Patent: Nov. 27, 2001

(54) R/D CONVERTER

(75) Inventor: Takao Takehara, Ota-ku (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

(21) Appl. No.: 09/471,389

(22) Filed: Dec. 23, 1999

(30) Foreign Application Priority Data

May 31, 1999 (JP) .................................................. 11-150987

(51) Int. Cl.[7] .................................................... H03M 1/48
(52) U.S. Cl. ............................ 341/111; 341/116; 318/632
(58) Field of Search .................................... 341/111, 110, 341/116, 115, 117, 118, 112; 364/559; 318/632, 608, 605

(56) References Cited

U.S. PATENT DOCUMENTS

| | | | |
|---|---|---|---|
| 4,486,845 | * 12/1984 | Duckworth | 364/559 |
| 4,857,926 | * 8/1989 | Neglia et al. | 341/116 |
| 4,933,674 | * 6/1990 | Gasperi et al. | 341/116 |
| 4,989,001 | * 1/1991 | Serev | 341/116 |
| 5,162,798 | * 11/1992 | Yundt | 341/116 |
| 5,455,498 | * 10/1995 | Kakimoto et al. | 318/605 |
| 5,646,496 | * 7/1997 | Woodland et al. | 318/632 |
| 5,796,231 | * 8/1998 | Kyodo | 318/608 |

* cited by examiner

*Primary Examiner*—Brian Young
*Assistant Examiner*—John Nguyen
(74) *Attorney, Agent, or Firm*—Oliff & Berridge, PLC

(57) ABSTRACT

There is provided an R/D converter capable of realizing a high speed response. When a sine wave for excitation of a resolver is a positive (or negative) maximum value, an AD converter makes AD conversion of a sine-wave output and a cosine-wave output of the resolver and makes input to a DSP. The DSP calculates on the basis of the input data, and outputs an obtained digital value to a DA converter and the like. Since the DSP calculates a rotor shaft angle, as compared with prior art (R/D converter of a tracking system) which includes a close loop made up of a demodulator circuit, a voltage controlled oscillator, and the like, and carries out a kind of PLL control, it becomes possible to carry out rotor shaft angle calculation at higher speed, and the high speed response can be realized by this. Since the rotor shaft angle is obtained through a digital operation, a compensation circuit of temperature drift, which has been required in the prior art, becomes unnecessary, and by that, the whole structure becomes simple, and the cost can be reduced.

8 Claims, 12 Drawing Sheets

F I G. 5
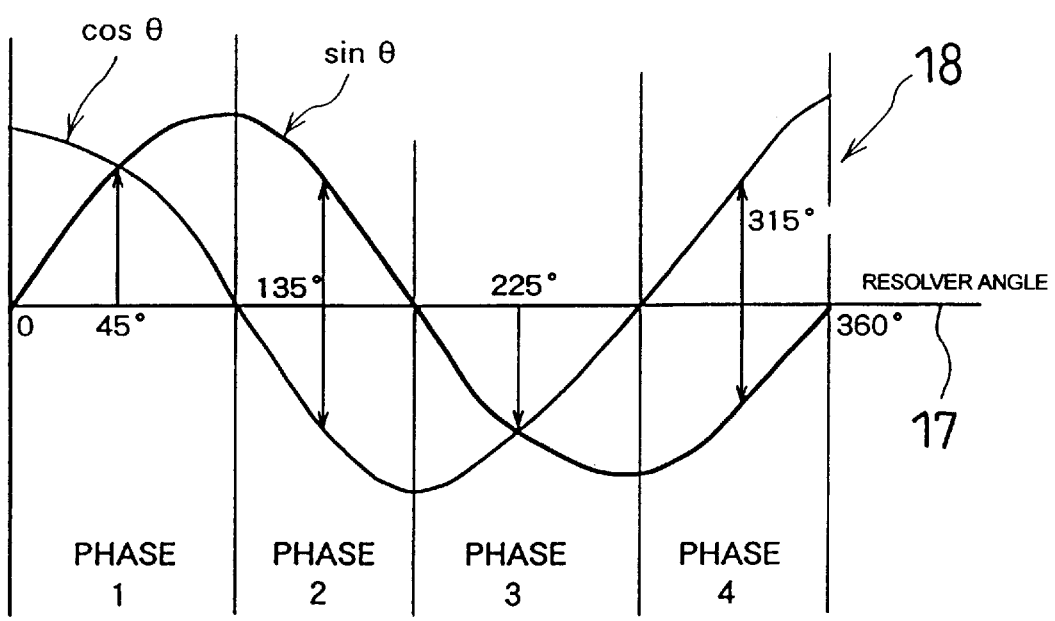

R/D CONVERTER

BACKGROUND OF THE INVENTION

1. Field of the Invention

The present invention relates to a converter for digitizing the output of a resolver (hereinafter referred to as R/D converter).

2. Description of the Related Art

A resolver is a kind of rotary transformer, and includes two stator windings and one rotor winding. The two stator windings are mechanically disposed at an angle of 90 degrees. The amplitude of a signal obtained by coupling to the stator windings becomes a function of relative position between the position of the rotor (shaft) and the stator. Thus, two kinds of output voltages (S3–S1, S4–S2), which are modulated by a sine (sine wave) and a cosine (cosine wave) of a shaft angle and are expressed by the following equations (1) and (2), are obtained from the resolver. Although equation (5) indicates a signal of a resolver format, the signal of the resolver format is based on a signal [output voltages (S3–S1) and (S4–S2)] obtained from the resolver output.

$$S3-S1 = E_0 \sin \omega t \sin \theta \quad (1)$$

$$S4-S2 = E_0 \sin \omega t \cos \theta \quad (2)$$

Where, $\theta$ is an axial angle, $\omega$ is an angular velocity corresponding to a rotor excitation frequency (f), and $E_0$ is an rotor excitation amplitude.

Here, using AD2S90 of Analog Device Company as an example, a conventional resolver digital converter (R/D converter 1) of a tracking system will be described.

FIG. 13 is a functional block diagram of the AD2S90.

In FIG. 13, when a transducer passes through a position equivalent to a least significant bit, the output is renewed by only 1 LSB. Renewal of CLKOUT corresponds to increase of 1 LSB.

When the present word state of an up-down counter 2 is made $\phi$, the output voltage (S3–S1) is multiplied by $\cos \phi$ through a sine cosine multiplier 3, and the output voltage (S4–S2) is multiplied by $\sin \phi$, whereby signals expressed by the following equations (3) and (4) are obtained.

$$E_0 \sin \omega t \sin \theta \cos \phi \quad (3)$$

$$E_0 \sin \omega t \cos \theta \sin \phi \quad (4)$$

The signals expressed by the equations (3) and (4) are subtracted through an error amplifier 4, whereby a signal expressed by the following equation (5) is obtained.

$$E_0 \sin \omega t (\sin \theta \cos \phi - \cos \theta \sin \phi) = E_0 \sin \omega t \sin(\theta-\phi) \quad (5)$$

Where, $(\theta-\phi)$: angular error.

A demodulator circuit 5 and an integrator 6 are connected to an output side of the error amplifier 4, and a voltage controlled oscillator (VCO) 7 is connected to the demodulator circuit 5 and the integrator 6. The demodulator circuit 5, the integrator 6, and the VCO 7 form a close loop, and operate in such a manner that $\sin(\theta-\phi)$ [see the equation (5)] is made zero. When this operation is realized, the word state $\phi$ of the up-down counter 2 connected to the sine cosine multiplier 3 becomes equal to the resolver shaft angle $\theta$.

However, in the foregoing R/D converter 1 of the tracking system shown in FIG. 13, attention has not been paid in the following points.

(a) Since it is a kind of PLL control, response speed is low. Particularly, as resolution becomes high, the response speed becomes low.

(b) It is necessary to compensate temperature drift of the analog operating circuit (the sine cosine multiplier 3, the demodulator circuit 5, etc.), so that its IC circuit becomes complicated and expensive.

(c) If an interface cable between the resolver (not shown) and the R/D converter 1 becomes long, a phase becomes large because of delay between the excitation sine wave and the sine-wave output and cosine-wave output of the resolver, and an angular error becomes large.

SUMMARY OF THE INVENTION

The present invention has been made in view of the above-described circumstances, and an object of the invention is to provide an R/D converter which enables high speed response. Another object of the invention is to eliminate temperature drift compensation and to make an apparatus inexpensive.

According to a first aspect of the invention, an R/D converter comprises a digital signal processing processor to which data obtained through AD conversion of sine-wave output and cosine-wave output of a resolver are inputted, wherein the digital signal processing processor obtains a rotor shaft angle of the resolver through a digital operation on the basis of the digital input data.

According to a second aspect of the invention, in the structure of the first aspect, the R/D converter is characterized in that the digital signal processing processor inputs digital data for an excitation sine wave of the resolver to a DA converter, and the DA converter obtains the excitation sine wave of the resolver on the basis of the input data from the digital signal processing processor.

According to a third aspect of the invention, in the structure of the second aspect, the R/D converter is characterized in that at a specific phase time of the excitation sine wave of the resolver, a sine-wave output signal and a cosine-wave output signal of the resolver are subjected to AD conversion, and the rotor shaft angle of the resolver is calculated.

According to a fourth aspect of the invention, in the structure of any one of the first to third aspects, the R/D converter is characterized in that a quadrant formed by dividing an angular space of the resolver into four equal parts is obtained, the rotor shaft angle of the resolver in the quadrant is obtained on the basis of polarities of the sine-wave output and the cosine-wave output of the resolver, and an initial angle of a rotor shaft angle for calculating VCO is set at the center of each quadrant obtained by dividing into four equal parts.

According to a fifth aspect of the invention, in the structure of the fourth aspect, the R/D converter is characterized in that a sin value corresponding to a difference between the rotor shaft angle of the resolver and an angle corresponding to an address of a sine-wave table is calculated, and an angle of the VCO is increased or decreased on the basis of size relation between the rotor shaft angle of the resolver and the angle of the VCO.

According to a sixth aspect of the invention, in the structure of the fifth aspect, the R/D converter is characterized in that the quadrant is set such that a value in the angular space becomes large from the left to the right, and in the quadrant, if the rotor shaft angle of the resolver exists on the right side as compared with the angle of the VCO, the angle of the VCO is made to increment.

According to a seventh aspect of the invention, in the structure of the fifth aspect, the R/D converter is characterized in that the quadrant is set such that a value in the angular space becomes large from the left to the right, and in the quadrant, if the rotor shaft angle of the resolver exists on the left side as compared with the angle of the VCO, the angle of the VCO is made to decrement.

According to an eighth aspect of the invention, in the structure of any one of the aspects 5 to 7, the R/D converter is characterized in that an AD conversion value of the sine-wave output of the resolver and a sin value of the angle of the VCO are compared with each other, an address corresponding to an angle of the sine-wave table is increased or decreased by one bit at a time according to the rotor shaft angle in the quadrant, and an angle corresponding to the address is made to approach the rotor shaft angle.

According to a ninth aspect of the invention, in the structure of any one of the fifth to seventh aspects, the R/D converter is characterized in that a rotor angle displacements $\Delta\theta$ is calculated from AD conversion values of the sine-wave output and the cosine-wave output of the resolver and a sin value and a cos value of the angle of the VCO, and an address corresponding to the angle of the VCO is jumped by a jump amount expressed by $\Delta\theta/K$.

BRIEF DESCRIPTION OF THE DRAWINGS

In the accompanying drawings:

FIG. 5 is a view showing angles of a resolver and an initial value of a VCO (sine-wave table);

DETAILED DESCRIPTION OF THE PREFERRED EMBODIMENTS

Figure 1:
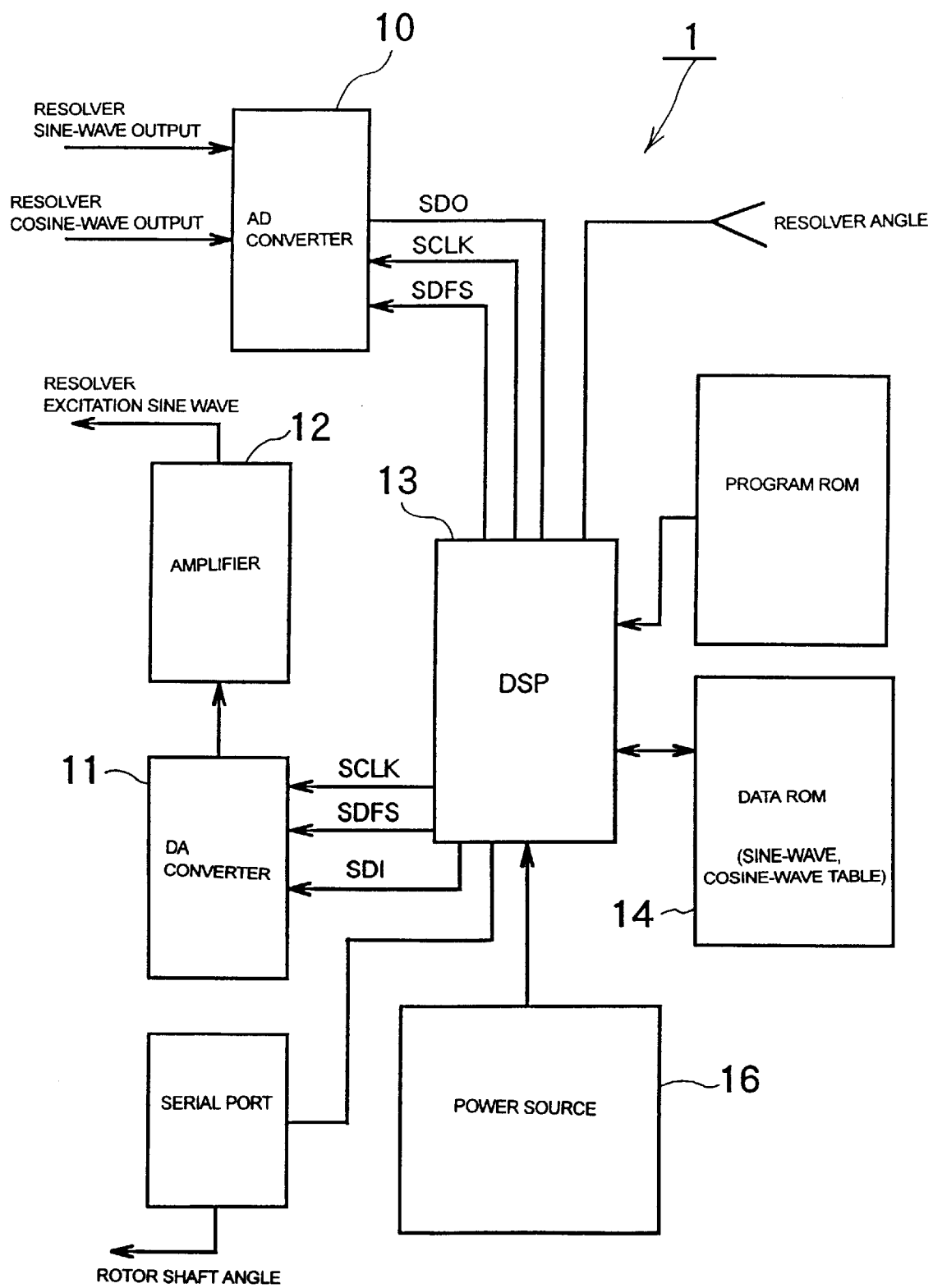
FIG. 1 is a block diagram showing an R/D converter of an embodiment of the present invention.

An R/D converter according to an embodiment of the present invention will be described below with reference to FIGS. 1 to 5. In FIG. 1, an R/D converter 1 is substantially made up of an AD converter 10 to which sine-wave output and cosine-wave output of a resolver (not shown) are inputted, a DA converter 11 for outputting an excitation sine wave for the resolver, an amplifier 12 which is provided between the resolver and the DA converter 11 and amplifies an output signal from the DA converter 11, a DSP (digital signal processing processor) 13 which is provided between the AD converter 10 and the DA converter 11, a data ROM 14 connected to the DSP 13 and storing sine-wave and cosine-wave tables for calculation of a rotor shaft angle, and a program ROM 15 for storing program. A serial port 13A for outputting data expressing the rotor shaft angle is connected to the DSP 13. In FIG. 1, reference numeral 16 designates a power source connected to the DSP 13 and supplying electric power to the R/D converter 1.

As described above, the output (sine-wave output and cosine-wave output) of the resolver is inputted to the AD converter 10. The precision (resolution) of the AD converter 10 is provisionally made 16 bits.

The DSP 13 outputs input data (word clock SDFS, bit clock SCLK, serial data SDO) to the DA converter 11, and calculates the rotor shaft angle of the resolver on the basis of the output data of the AD converter 10 (AD conversion output SDO of the sine-wave output and cosine-wave output).

Next, a method of calculating an angle will be described with reference to FIGS. 2, 3 and 4.

Figure 2:
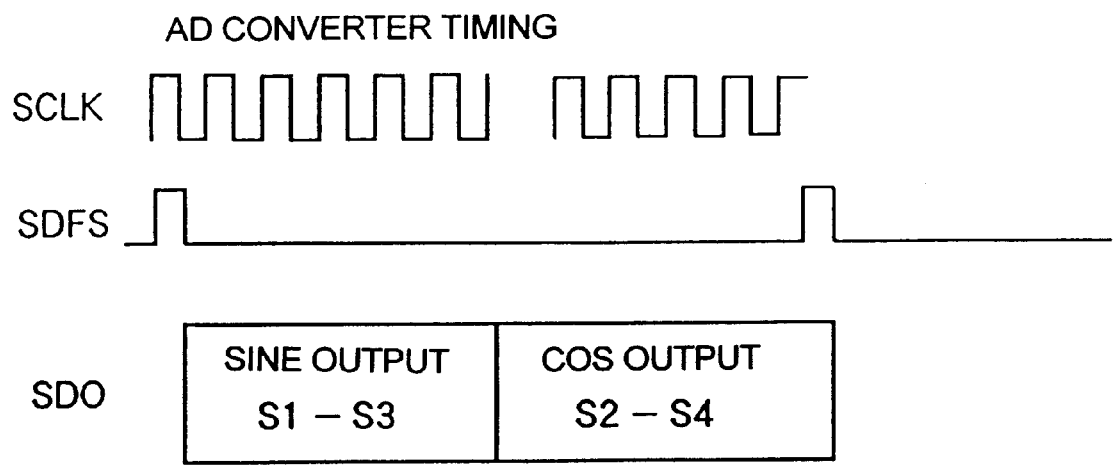
FIG. 2 is a view showing operation timing of an AD converter of FIG. 1.

FIG. 2 shows operation timing of the AD converter 10.

When a sampling frequency is made 10 KHz, one fourth frequency of the word clock SDFS becomes the sampling frequency. When the resolution of the AD converter 10 is made 16 bits, the AD conversion output SDO of the sine-wave output and cosine-wave output of the resolver in one period of the wordclock SDFS is outputted in a serial format to a serial port (receiving portion) of the DSP 13, and serial data are taken in the serial port at the leading edge of the bit clock SCLK.

Figure 3:
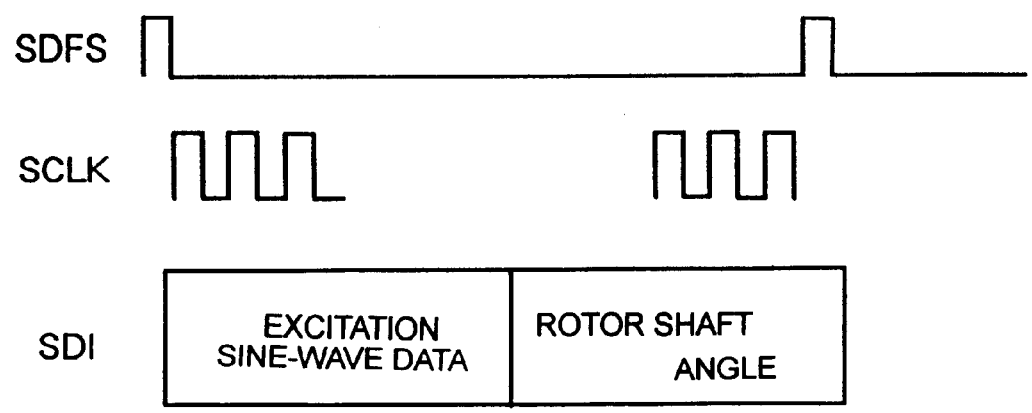
FIG. 3 is a view showing operation timing of a DA converter of FIG. 1.
Figure 4:
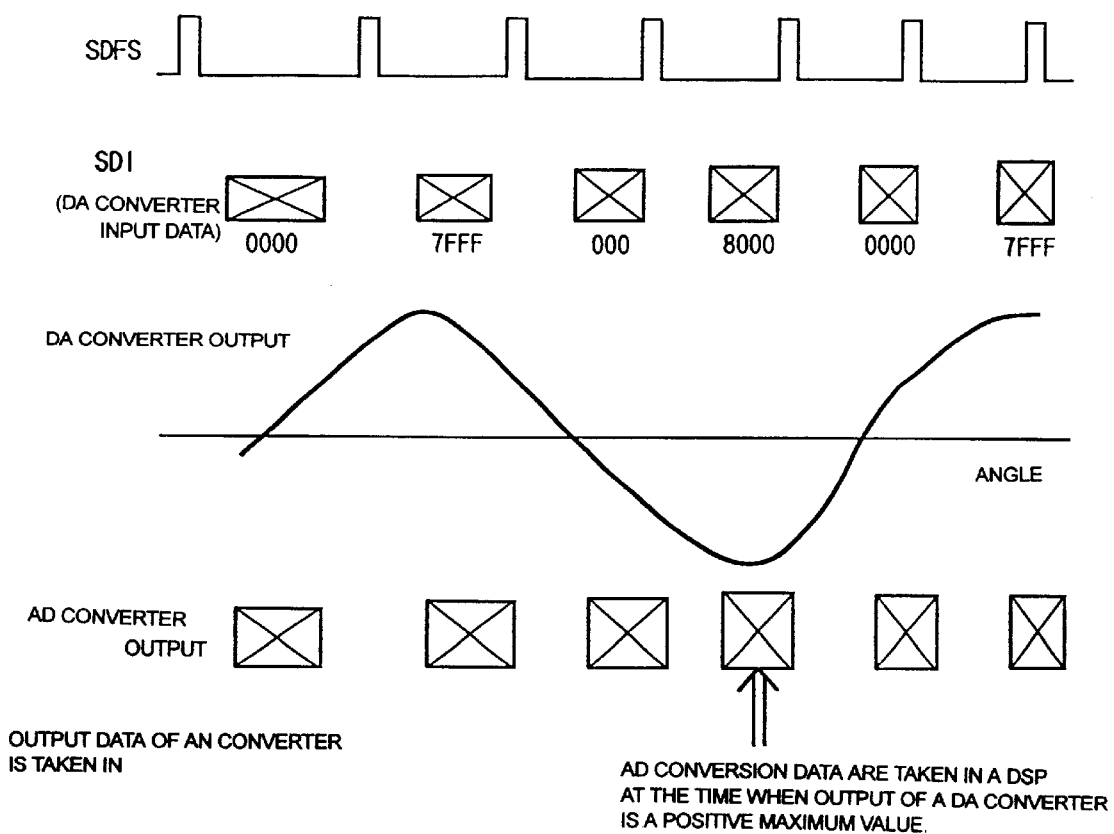
FIG. 4 is a view showing input timing of AD conversion data to a DSP.

FIG. 3 shows timing when sine-wave data for excitation of the resolver are inputted to the DA converter 11. The sampling frequency is set 40 KHz, and the serial data SDI are inputted to the DA converter 11 so that a sine wave of 10 KHz is obtained. The output of the DA converter 11 (sine wave for excitation of the resolver) is inputted to the amplifier 12 and is amplified so that a winding output voltage (sine-wave output and cosine-wave output) of the resolver comes to have a suitable value, and is supplied to the resolver as the sine wave for excitation. In response to this, the sine-wave output and cosine-wave output of the resolver are taken in the DSP 13 as shown in FIG. 4.

At this time, at a specific phase in one cycle of the sine wave for excitation of the resolver (that is, one time in one cycle), the AD converter 10 makes AD conversion of the sine-wave output and the cosine-wave output of the resolver, and the AD conversion values are taken in the DSP 13. Like this, if the AD conversion values are taken in the DSP 13 at the specific phase of the sine wave for excitation of the resolver, sin $\omega$t of equation (5) can be regarded as a constant, and the equation (5) becomes sin($\theta-\phi$).

That is, the sampling frequency of AD conversion becomes 10 KHz.

The sine-wave table writes into the data ROM 14 values of 16 bits of sin to an angle [address of the data ROM 14 (address of the table)] obtained by dividing a 360° angular space of the resolver into 4096 (12 bits) equal parts.

The polarity of the AD conversion value of the sine-wave and cosine-wave output of the resolver is checked, so that the present position (present shaft angle) of the rotor of the resolver is judged.

As shown in FIG. 5, the 360° angular space is divided into four parts, and the part of 0–90° is made PHASE 1, the part of 90–180° is made PHASE 2, the part of 180–270° is made PHASE 3, and the part of 270–360° is made PHASE 4. That is, as shown in FIG. 5, a quadrant 18 is set by a horizontal axis 17 or the like along which an angle value becomes large from 0° to 360° toward the right from the left. An initial angle (address of the sine-wave table) [angle=φ] of a rotor shaft angle calculating VCO (sine-wave table) is set at the center of each angular space (PHASE 1, PHASE 2, PHASE 3 and PHASE 4).

Next, angle displacements Δθ is calculated as Δφ=sin θcos φ−cos θsin φ=sin(θ−φ) [see equation (5)]. Incidentally, since the phase of cos φ advances by 90° to sin φ, it is obtained by reading out a sin value at an address of φ+90° from the data ROM 14.

Here, by checking the polarity of the angle displacements Δθ, size relation between the rotor shaft angle θ of the resolver and the angle φ of the rotor shaft angle for calculating VCO (sin e-wave table) [the rotor shaft angle for calculating VCO (sine-wave table) functions similarly to the voltage controlled oscillator (VCO) 7, and is hereinafter referred to as VCO for convenience] becomes apparent.

That is, when the angle displacements Δθ>0 is realized, the angle φ of the VCO is smaller than the rotor shaft angle θ. When the angle displacement Δθ<0 is realized, the angle φ of the VCO is larger than the rotor shaft angle θ.

Next, for the purpose of estimating a difference (angle difference) between the angle φ of the VCO and the rotor shaft angle θ, the angle displacements Δθ is divided by a constant K.

Here, if D=Δθ/K (D: jump amount), φ=φ+D becomes a new address. That is, an address corresponding to the angle of the VCO is jumped by a jump amount expressed by Δθ/K (K: constant). Thus, it becomes possible to increase a calculation speed.

Since a sin function is not linear to an angle, the constant K is set such that a difference (angle difference) between the jumped new address (angle φ) and the rotor shaft angle θ is not changed in relation to a difference (angle difference) between the angle φ of the VCO and the rotor shaft angle θ.

Figure 12:
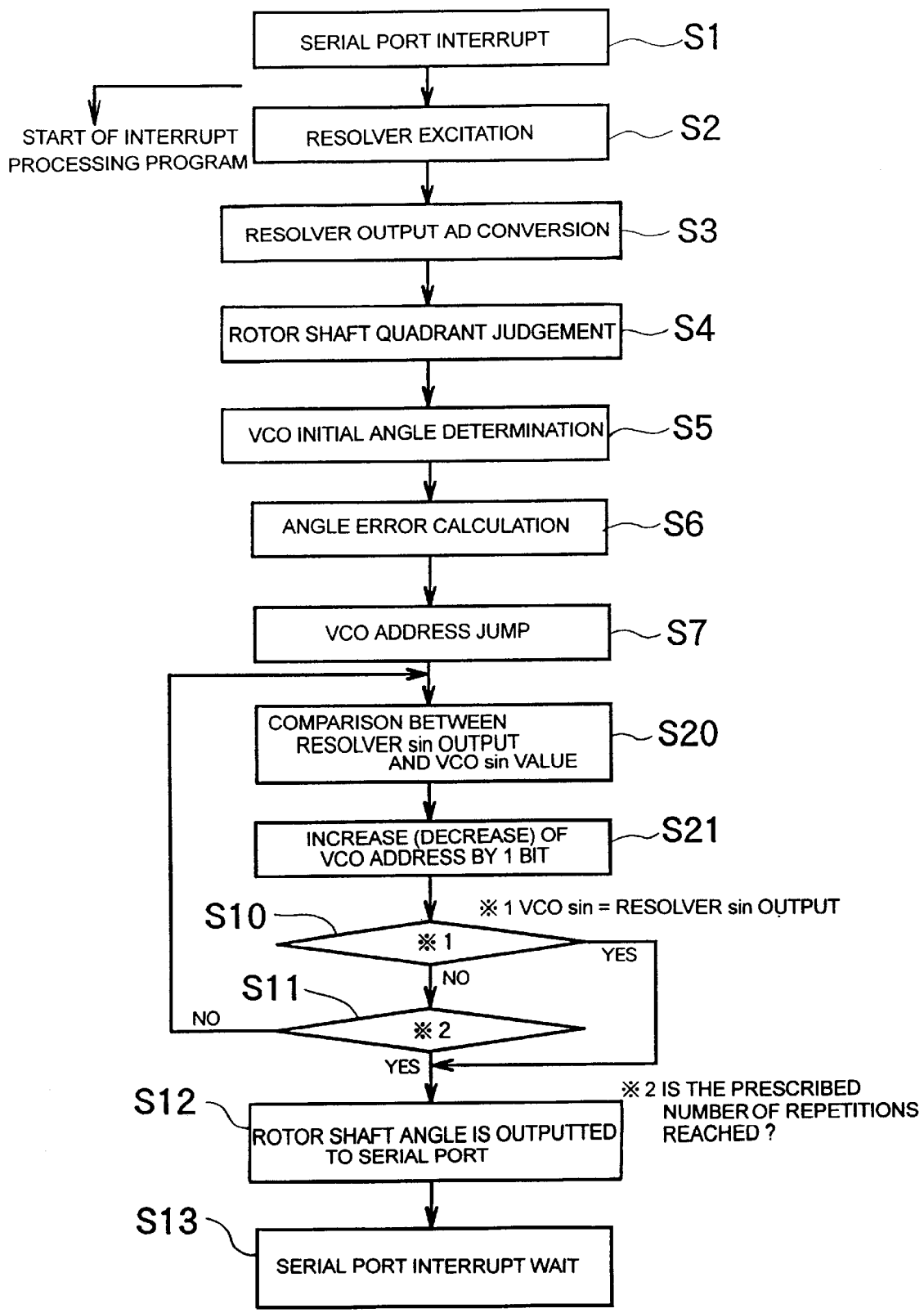
FIG. 12 is a flow chart showing another example of a control method of the R/D converter of the embodiment.
Figure 13:
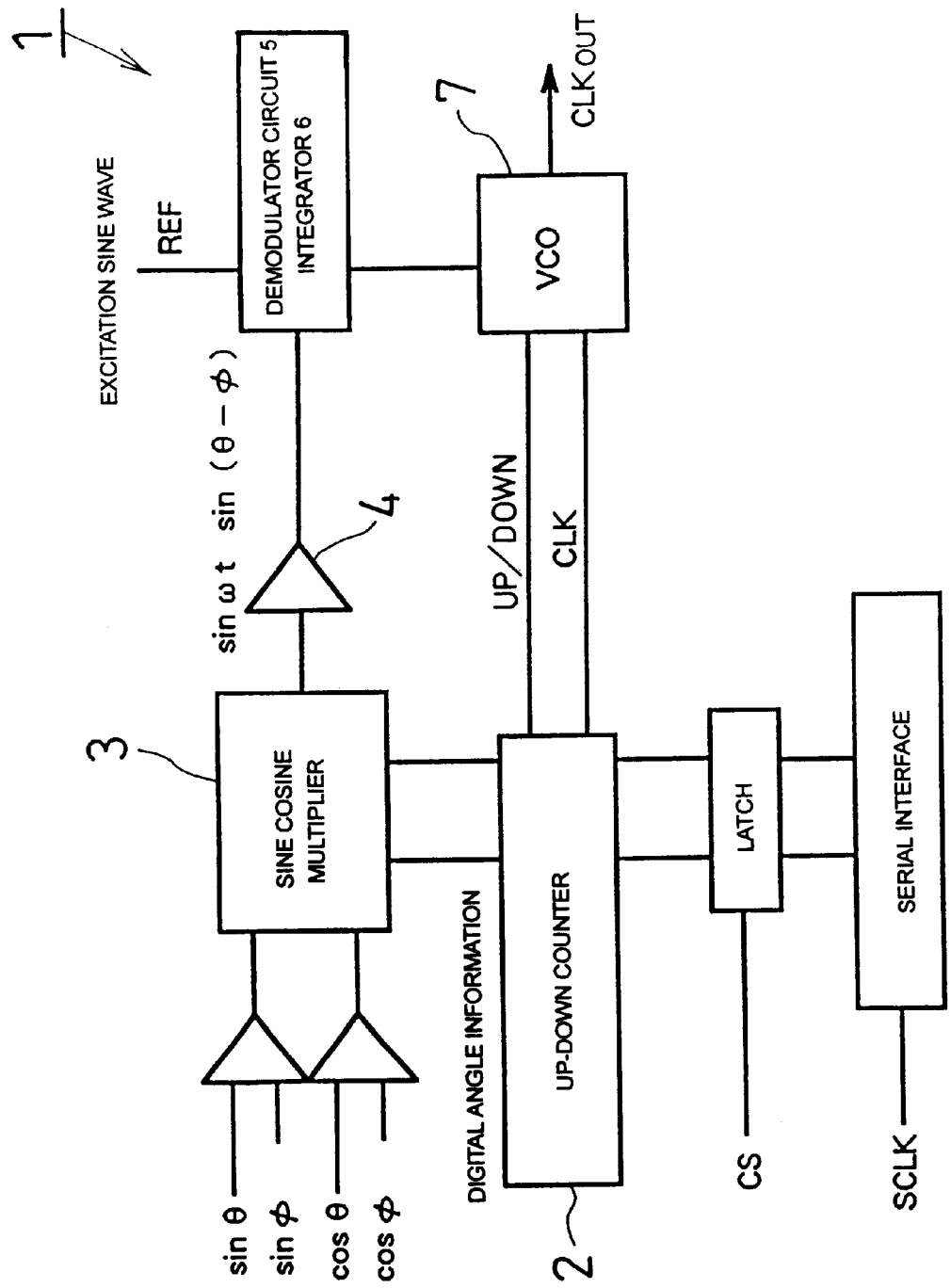
FIG. 13 is a block diagram showing an example of a conventional R/D converter.

Next, sin φ and sin θ are compared with each other (see step S20 of FIG. 12), and according to their relation in magnitude (see step S10 and step S11 of FIG. 12), the address of the VCO (sine-wave table) is made to increase or decrease (increment or decrement) by 1 LSB at a time (see step S21 of FIG. 12).

The processing procedures are opposite between a region (PHASE 1 and PHASE 4) in which a sin value increases as an angle increases and a region (PHASE 2 and PHASE 3) in which it decreases.

First, a case where the rotor shaft angle exists in the PHASE 1 and PHASE 4 will be described.

In the case of sin φ<sin θ, since the angle φ of the VCO is smaller than the rotor shaft angle θ, the address of the VCO is made to increment by 1 LSB at a time until sin φ≧sin θ is realized. In the case of sin φ=sin θ (YES at step S10 of FIG. 12), since the address (angle φ) of the VCO is equal to the rotor shaft angle θ, the address of the VCO is outputted to the serial port of the DSP 13 (step S12 of FIG. 12).

In the case of sin φ>sin θ, the address (angle φ) of the VCO is made to decrement by 1 LSB. In this case, since an infinite loop comes to occur, a loop counter is set, and when tracking operations reach the predetermined number of times (for example, YES at similar step S11 of FIG. 12), the address of the VCO is outputted to the serial port (see step S12 of FIG. 12).

Next, a case where the rotor shaft angle exists in the PHASE 2 and PHASE 3 will be described.

In the case of sin φ<sin θ, since the angle φ of the VCO is larger than the rotor shaft angle θ, the address of the VCO is made to decrement by 1 LSB at a time until sin φ≧sin θ is realized (step S21 of FIG. 12). In the case of sin φ=sin θ (YES at step S10 of FIG. 12), since the address (angle φ) of the VCO is equal to the rotor shaft angle θ, the address of the VCO is outputted to the serial port of the DSP (step S12 of FIG. 12).

The foregoing calculation is carried out in one sampling period of AD conversion. Thus, a high speed response becomes possible.

As described above, since the address of the VCO (sine wave table) is made to increase or decrease (increment or decrement) by 1 LSB at a time according to the relation in magnitude between the angle φ of the VCO and the rotor shaft angle θ, position detection (position judgement) with high precision can be made.

As described above, in this embodiment, the rotor shaft angle of the resolver is calculated by the DSP 13. As compared with the prior art (R/D converter 1 of the tracking system) for performing a kind of PLL control including the close loop made up of the demodulator circuit 5, the voltage controlled oscillator (VCO 7), and the like, it becomes possible to perform the rotor shaft angle calculation at higher speed, and the response speed can be improved by this. For example, although the tracking rate is about 400 Hz in the conventional R/D converter 1 of the tracking system due to the PLL control, the tracking rate can be improved according to this embodiment, and for example, it can be made about 10 KHz. Besides, even in the case where high resolution is made, high speed response can be maintained.

Besides, when the sine wave for excitation of the resolver has the positive (or negative) maximum value (once for 1 cycle), the AD converter 10 performs AD conversion of the sine-wave output and cosine-wave output of the resolver, so that the demodulator circuit 5 which has been required in the foregoing prior art becomes unnecessary. Thus, the response speed can be further improved by the omission of the operation of the demodulator circuit as compared with the prior art.

At the specific phase time of the sine wave for excitation of the resolver (once for 1 cycle), the AD converter 10 performs the AD conversion of the sine-wave output and cosine-wave output of the resolver, so that the sine wave for excitation can be regarded as a constant. Thus, it is possible to eliminate an increase of an angle error due to a positional shift between the excitation sine wave and the sine-wave output and cosine-wave output of the resolver, and even if an interface cable between the resolver and the R/D converter 1 becomes long, the angle error can be made small.

Besides, the DSP 13 is provided between the AD converter 10 and the DA converter 11, makes calculation on the basis of digital values of the sine-wave output and cosine-wave output of the resolver inputted through the AD converter 10, and outputs an obtained digital value of the rotor shaft angle to the serial port. Since the DSP performs the digital operation of rotor shaft angle calculation, a compensation circuit of temperature drift which has been required in the prior art becomes unnecessary, and by this, the total structure becomes simple, and the cost can be made low. Besides, a comparatively inexpensive digital IC can be used for the DSP 13, and by this, the cost of the whole apparatus can be further made low.

Incidentally, since the resolution of the rotor shaft angle is 12 bits, it is satisfactory if the precision of sin and cos values of the AD converter 10, and the sine-wave and cosine-wave table is 12 bits or more.

The structure of the DSP 13, its operation contents and the like will be described below with reference to FIGS. 6 to 12 in more detail.

Figure 6:
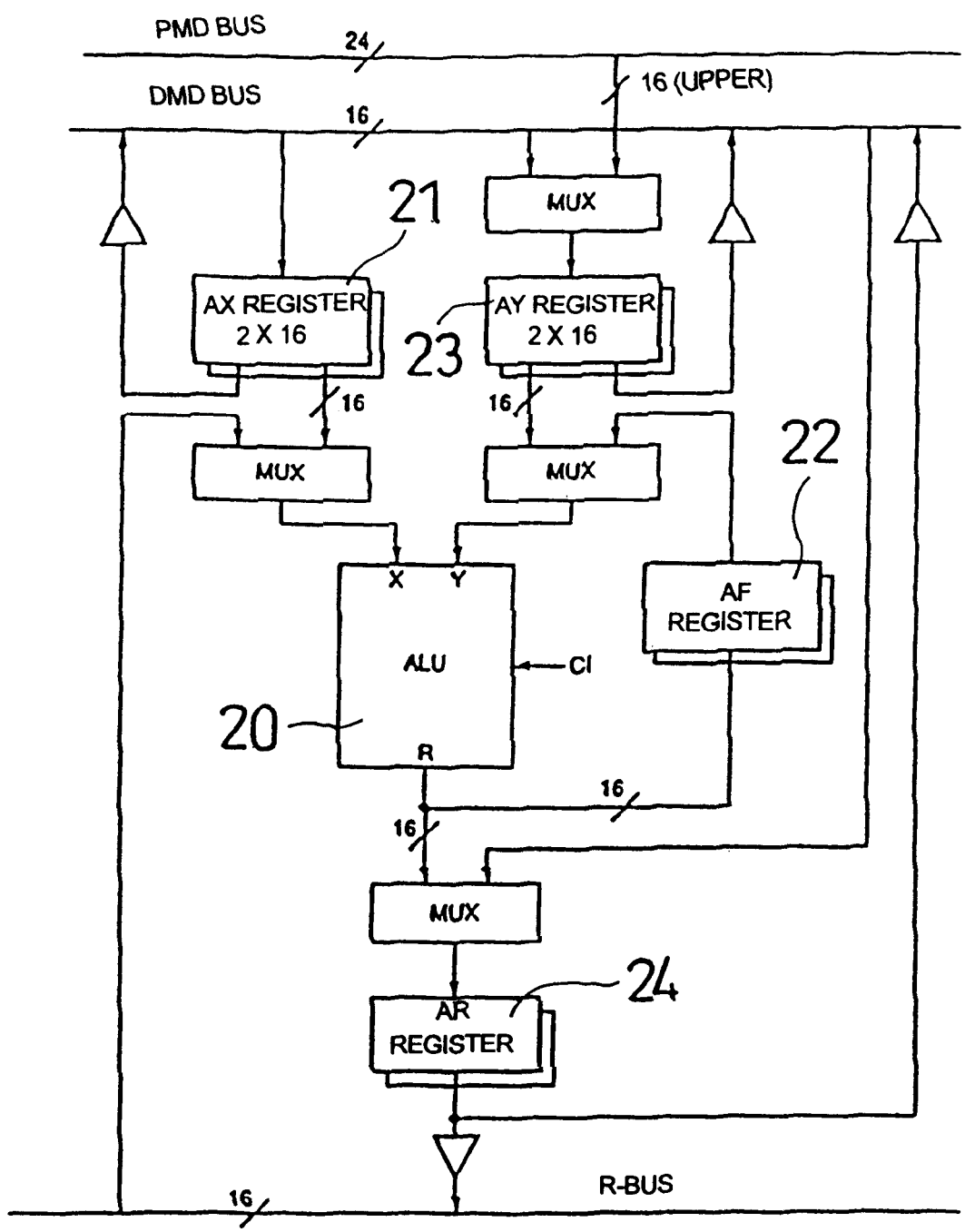
FIG. 6 is a block diagram showing an ALU constituting the DSP.

First, with respect to the software of the DSP 13, its operation will be described with ADSP2181 of a 16-bit fixed-point DSP of Analog Device Co., as an example. FIG. 6 is a block diagram of an arithmetic/logic unit (ALU 20) of the DSP 13.

The ALU 20 is a 16-bit width unit having two 16-bit input ports X and Y and one 16-bit output port R. The input port X of the ALU 20 receives data from an AX register file or result (R) bus. The R bus is connected to output registers of all arithmetic units, and can directly use these output registers as input operand.

The AX register file is exclusively used for the input port X, and is constituted by two registers $AX_0$ and $AX_1$. These AX registers 21 are readable and writable from a DMD (data memory data) bus. The input port Y of the ALU 20 receives data from an AY register file and an ALU feedback (AF) register (AF register 22). An AY register 23 is exclusively used for the input port Y, and is constituted by two registers $AY_0$ and $AY_1$. These registers are readable and writable from the DMD bus. The output of the ALU 20 is loaded into the AF register 22 or an ALU result (AR) register (AR register 24).

The AF register 22 is an internal register of the ALU 20, and the operation result of the ALU 20 can be made the Y input of the ALU 20. The contents of the AR register 24 can be outputted to the DMD bus and the R bus. The AR register 24 can be directly loaded from the DMD bus. Next, memories will be described. The ADSP2181 adopts an improved Harvard structure in which data are stored in a data memory, and both instructions and data are stored in a program memory. Besides, it includes a RAM disposed at a part of a program memory space and at a part of a data memory space.

Next, the serial port will be described.

Figure 7:
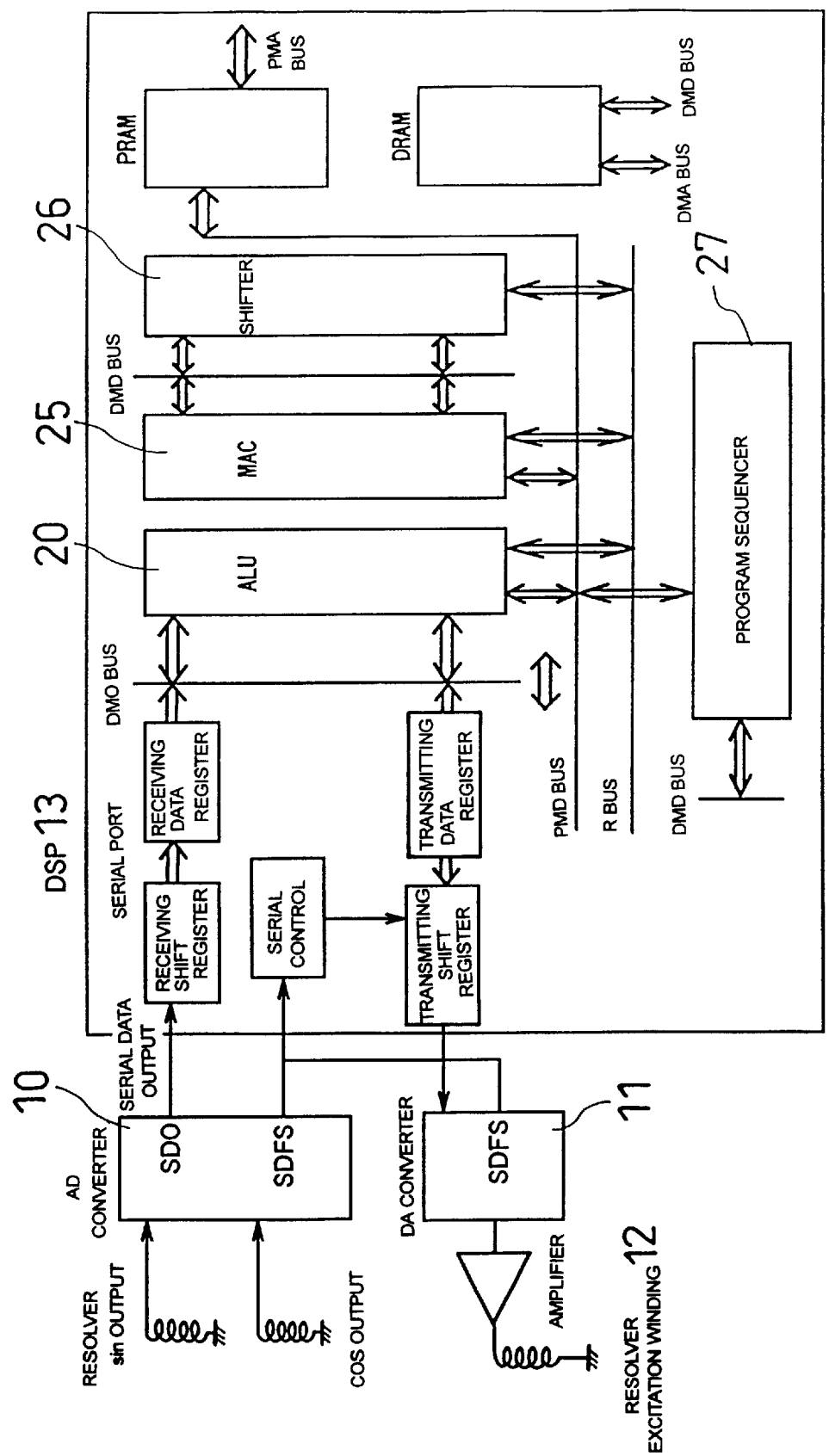
FIG. 7 is a block diagram showing the R/D converter.
Figure 8:
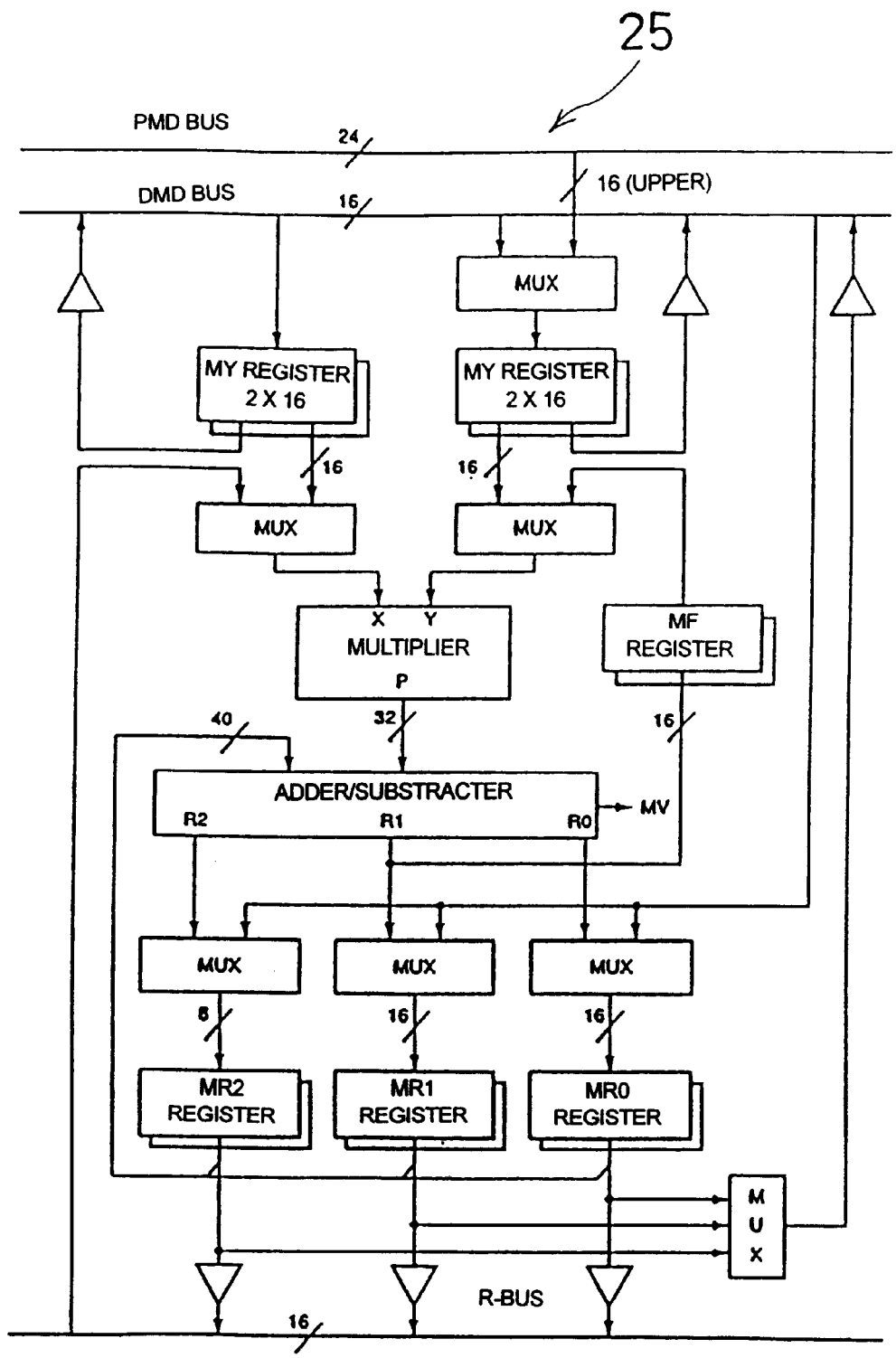
FIG. 8 is a block diagram showing a MAC constituting the DSP.
Figure 9:
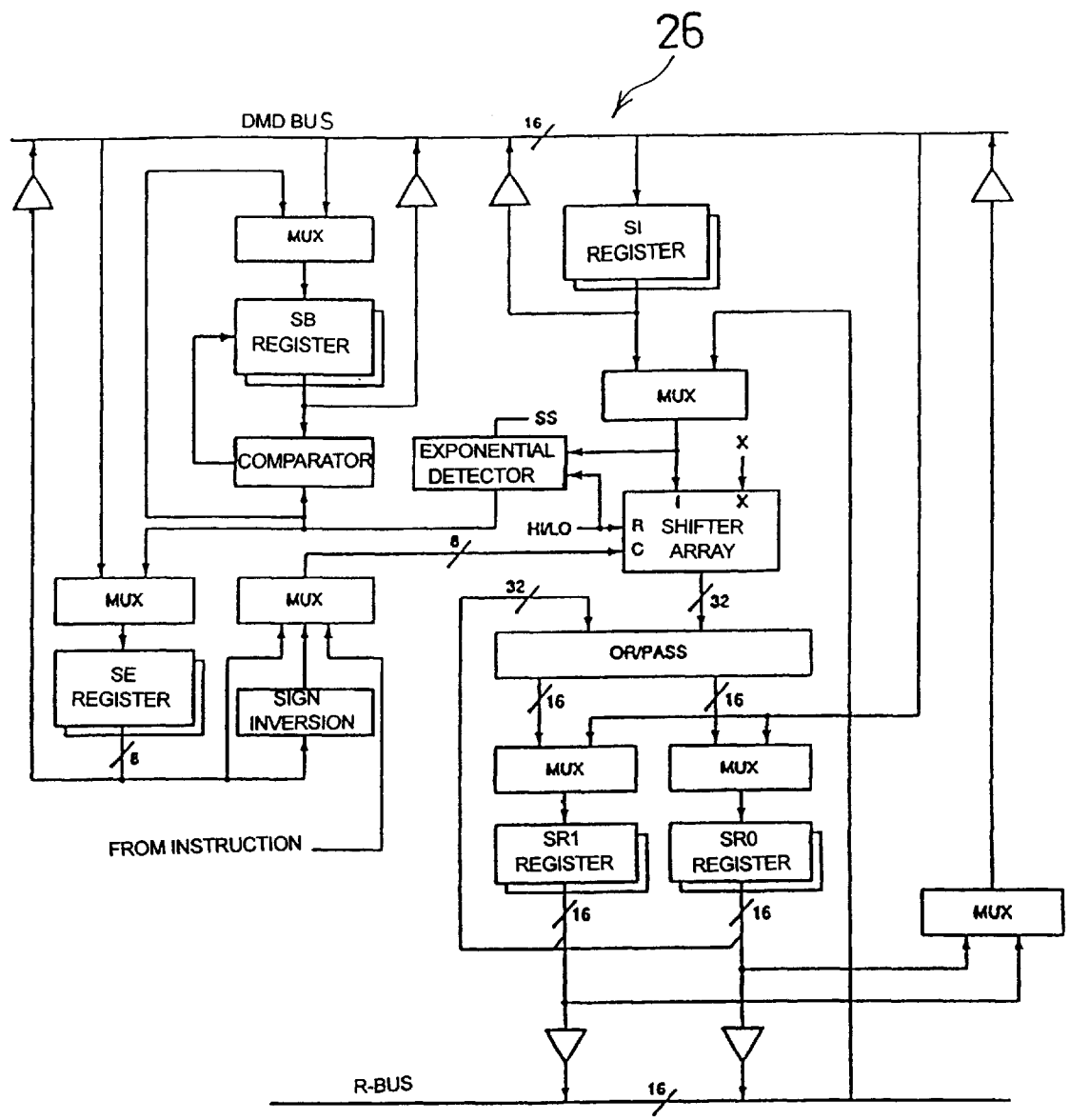
FIG. 9 is a block diagram showing a shifter constituting the DSP.
Figure 10:
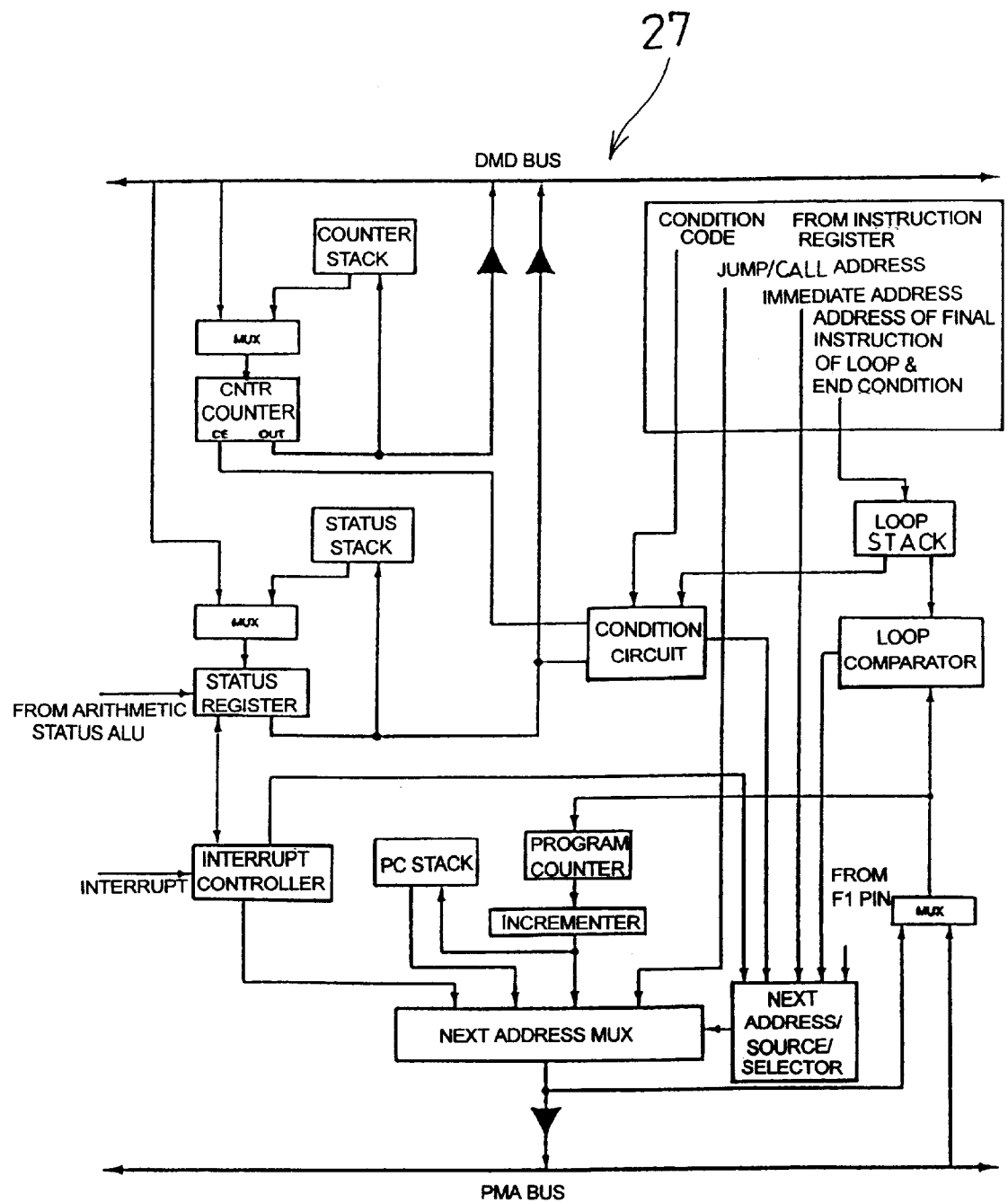
FIG. 10 is a block diagram showing a program sequencer constituting the DSP.

This port can directly interface with the AD converter 10 and the DA converter 11. It can also output the rotor shaft angle to the outside. Besides, this port can receive an external clock. FIG. 7 is a block diagram of the R/D converter 1. FIG. 8 is a block diagram of a MAC 25 constituting the DSP 13, FIG. 9 is a block diagram of a shifter 26 constituting the DSP 13, and FIG. 10 is a block diagram of a program sequencer 27 constituting the DSP 13. The MAC 25 carries out multiplication, multiplication with addition and subtraction, and multiplication with subtraction. The shifter 26 executes a shifting operation to shift a 16-bit input into a 32-bit output. The program sequencer 27 generates an instruction address, and flexibly controls a program flow.

Next, a control method of the R/D converter 1 will be described with reference to FIG. 11.

First, a serial port (SPORT) interrupt (step S1) is carried out.

At step S1, for the purpose of inputting data for the excitation sine wave of the resolver to the DA converter 11 through the SPORT, data are first written into a TX register of the SPORT. Transfer of serial data is started by an SDFS signal. When transmission (transfer) is started, the data written in the TX register are transferred to a transmission shift register. Then each bit is shifted at a rising edge of the SCLK while the MSB is made the head. After the first bit (MSB) of a word is transferred, the SPORT causes interrupt.

A jump instruction to an interrupt processing program is written at a position of an interrupt vector, so that interrupt processing is carried out.

A sampling frequency (SDFS) of the DA converter 11 is made 40 KHz. With respect to input data of the DA converter 11, data of 0000, 7FFF, 0000, and 8000 in 2' complement hexadecimal are cyclically transmitted through circular addressing, so that the excitation sine wave of 40/4=10 KHz is obtained (step S2). After a power source is applied, the above-described operation is carried out until the excitation state of the resolver becomes stable. A time for this initial stabilization is set by a timer. AD conversion of the resolver output is carried out at step S3 subsequent to step S2.

Here, the same signal is used for sampling clocks of AD conversion and DA conversion, and the excitation sine wave of the resolver is outputted, and at the same time, the sine-wave output and the cosine-wave output of the resolver are AD converted, and the digital output is taken in the serial port (receiving portion) of the DSP 13. At the receiving portion, receiving bits are stored in the receiving serial port. When all word data are received, the data are written in a receiving data register, and receive interrupt of the SPORT occurs.

The AD conversion value of the sine-wave output of the resolver is stored at a (SININ) address of the data memory, and the cosine-wave output is stored at a (COSIN) address. The timing of taking in the A/D conversion output data for calculation of the rotor shaft angle is made the time of a specific phase of the excitation sine wave (for example, it is made a positive maximum value or negative maximum value. Incidentally, it is not limited to this, but a specific phase of . . . 23°, 75°, 138°, . . . may be adopted.). That is, the sampling frequency becomes 10 KHz. Specifically, the ADSP2181 is provided with two independent data address generators (DAG) so that access can be made to the program memory and the data memory at the same time. The DAG executes an indirect addressing function. Both the DAGs carry out an automatic address update operation. Input data of the DA converter 11 are stored in continuous four addresses of memory data. The circular addressing is carried out by the DAG, and AD conversion outputs (that is, sine-wave output and cosine-wave output of the resolver) at the time when the address at the specific phase (for example, positive maximum value) of the sine wave is outputted are written at the (SININ) address and the (COSIN) address respectively, and are used for angle calculation.

A rotor shaft quadrant judgement is carried out at step S4 subsequent to step S3.

At step S4, a quadrant of a rotor shaft angle is judged through polarities of the data at the (SININ) address and the (COSIN) address. That is, the quadrant is classified into (1) first quadrant (PHASE 1):

data at the (SININ) address $\geq 0$ and data at the (COSIN) address $\geq 0$, (2) second quadrant (PHASE 2):

data at the (SININ) address $\geq 0$ and data at the (COSIN) address <0, (3) third quadrant (PHASE 3):

data at the (SININ) address <0 and data at the (COSIN) address <0, (4) fourth quadrant (PHASE 4):

data at the (SININ) address <0 and data at the (COSIN) address $\geq 0$,

Next, determination of the initial angle of the VCO is made (step S5).

In accordance with the quadrant 18 (PHASE 1, PHASE 2, PHASE 3, PHASE 4), a sin value address of the VCO is set. The address is set at the center of each quadrant (PHASE 1, PHASE 2, PHASE 3, PHASE 4). Incidentally, the addresses of the VCO sine-wave table in the program memory is made 2000-2FFF address.

Setting is made as follows:

[1] First quadrant: 2000-23FF address
  sin value setting address of the VCO 2200 address
[2] Second quadrant: 2000-23FF address
  sin value setting address of the VCO 2600 address
[3] Third quadrant: 2000-23FF address
  sin value setting address of the VCO 2A00 address
[4] Fourth quadrant: 2000-23FF address
  sin value setting address of the VCO 2E00 address Angle error calculation is performed at subsequent step S6.

The AD conversion values of the sine-wave output and the cosine-wave output of the resolver are made [SININ] and [COSIN], respectively, a sin value corresponding to the initial setting address of the VCO is made [VCOSIN], and a cos value corresponding to the initial setting address of the VCO is made [VCOSCOS]. The cos value [VCOSCOS] corresponding to the initial setting address of the VCO becomes address contents obtained by adding 512 (decimal system) to the initial setting address of the VCO, since a phase difference between a sin value and a cos value is 90°. Next, the following equation is calculated.

$$\Delta\theta=[SININ]\times[VCOSCOS]-[COSIN]\times[VCOSCOS]$$

Next, an address jump of the VCO is performed (step S7).

When the address of the VCO is larger than the rotor shaft angle, an angle displacements $\Delta\theta<0$ is established. On the contrary, when the address of the VCO is smaller than the rotor shaft angle, the angle displacement $\Delta\theta>0$ is established. Thus, by judging the polarity of the angle displacement $\Delta\theta$, the relative position between the VCO and the rotor shaft angle can be recognized. A value D obtained by dividing the angle displacements $\Delta\theta$ by a constant K is made an address jump amount, and when the address (angle) of the VCO is made $\phi$, in the case where the address (angle) $\phi$ of the VCO is larger than the rotor shaft angle, $\phi-D$ becomes a new address.

In the case where the address (angle $\phi$) of the VCO is smaller than the rotor shaft angle, $\phi+D$ becomes a new address. Since a sin function is not a linear function to an angle, it is necessary to determine the value of the constant K such that the difference between the jump destination address of the VCO and the rotor shaft angle does not fluctuate due to the magnitude of difference between the VCO and the rotor shaft angle. In this embodiment, K=49 (decimal system) is set.

Subsequent to step S7, angle error calculation, and rotor shaft—VCO relative position judgement are made (step S8).

The value $D=\{\sin(\theta-\phi)\}/K$ corresponding to the new address of the VCO is calculated, and the address jump amount D is calculated. The amount D is added to or subtracted from the address of the VCO in accordance with the polarity of the amount D, so that the address is increased or decreased. That is, in the case where the amount D is negative, since the angle of the VCO is larger (positioned right) than the rotor shaft angle, the amount D is added to the address of the VCO. In the case where the amount D is positive, since the angle of the VCO is smaller (positioned left) than the rotor shaft angle, the amount D is subtracted from the address of the VCO. The sine-wave output of the resolver and the sin value of the VCO are compared with each other, and when (cos IN)−(sin IN)=0, the rotor shaft angle is outputted to the serial port (step S10). Since this operation becomes an infinite loop, a counter for the number of times of polarity inversions is set, and when the number of times of polarity inversions becomes equal to a count value of the counter (step S11), the angle error calculation is ended (step S9), and the address (rotor shaft angle) of the VCO is outputted to the serial port (step S12). Thereafter, going out of the interrupt processing program, the DSP 13 gets to be a state of interrupt wait (step S13).

Figure 11:
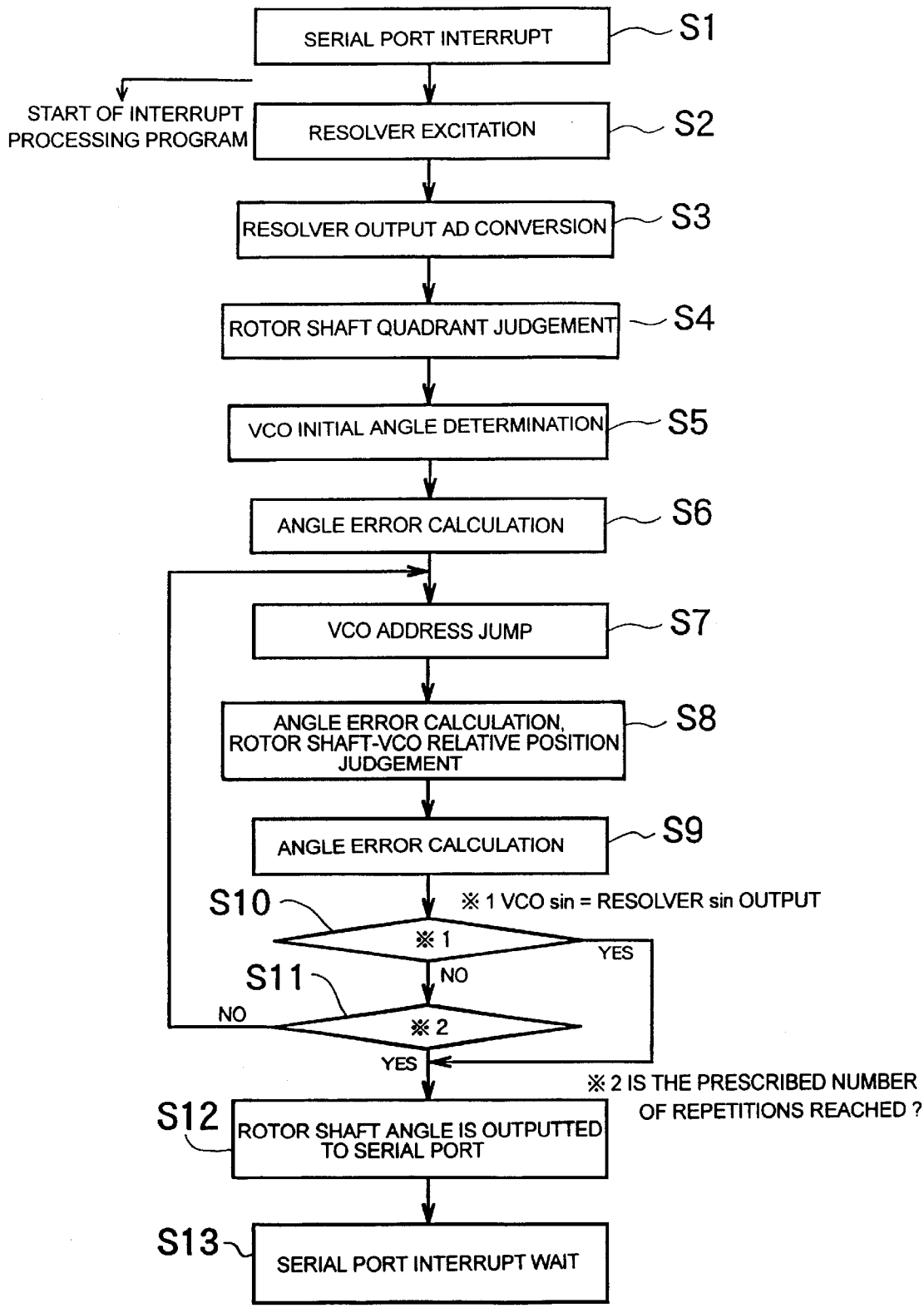
FIG. 11 is a flow chart showing a control method of the R/D converter of the embodiment.

Incidentally, instead of the step S8 and the step S9 of FIG. 11, step S20 and step S21 may be provided as shown in FIG. 12. At step S20, the sine-wave output (sin output) of the resolver and the sin value of the VCO are compared with each other. Then the sin value [VCOSIN] corresponding to a new address of the VCO and the sin output [SININ] of the resolver are compared with each other, and the address of the VCO is increased or decreased by 1 bit in accordance with the quadrant [(1) first and fourth quadrants, (2) second and third quadrants mentioned below].

(1) First and fourth quadrants (PHASE 1, PHASE 4):

In this region, since the sin value increases as the angle increases, in the case where [VCOSIN]−[SININ] is negative, the address of the VCO is made to increment by 1 bit. In the case where [VCOSIN]−[SININ] is positive, the address of the VCO is made to decrement by 1 bit.

(2) Second and third quadrants (PHASE 2, PHASE 3):

In this region, since the sin value decreases as the angle increases, in the case where [VCOSIN]−[SININ] is negative, the address of the VCO is made to decrement by 1 bit. In the case where [VCOSIN]−[SININ] is positive, the address of the VCO is made to increment by 1 bit.

[VCOSIN]−[SININ] is calculated, and when the polarity is not inverted, the foregoing operation is carried out. Further, [VCOSIN]−[SININ] is calculated, and when the value becomes zero, the address of the VCO is written at the transmission buffer address of the data memory. When the polarity of [VCOSIN]−[SININ] is inverted, an operation opposite to the foregoing operation is carried out. Since this operation becomes an infinite loop, a counter for the number of times of polarity inversions is set. When the number of times of polarity inversions becomes equal to a count value of the counter (YES at step S11), angle error calculation is ended, and the address (rotor shaft angle) of the VCO is outputted to the serial port (step S12). Thereafter, going out of the interrupt processing program, the DSP 13 gets to be a state of interrupt wait (step S13).

According to the first aspect of the invention, the digital signal processing processor calculates the rotor shaft angle of the resolver, and as compared with the prior art (R/D converter of the tracking system) for performing a kind of PLL control including the close loop made up of the demodulator circuit, the voltage controlled oscillator (VCO), and the like, it becomes possible to perform the rotor shaft angle calculation at higher speed, and the response speed can be improved by this.

Besides, the digital signal processing processor obtains the rotor shaft angle through a digital operation, so that a compensation circuit of temperature drift which has been required in the prior art becomes unnecessary, and by this, the total structure becomes simple, and the cost can be made low. Besides, a comparatively inexpensive digital IC can be used for the digital signal processing processor, and by this, the cost of the whole apparatus can be further made low.

According to the second aspect of the invention, such a structure can be made that at a specific phase time of the sine wave for excitation of the resolver, the sine-wave output signal and cosine-wave output signal of the resolver are subjected to AD conversion and are inputted to the gate array. By this, the demodulator circuit which has been required in the prior art becomes unnecessary, and as compared with the prior art, the response speed can be further improved by the omission of the calculation of the demodulator circuit.

According to the third aspect of the invention, at a specific phase time of the sine wave for excitation of the resolver, since the sine-wave output signal and cosine-wave output signal of the resolver can be subjected to AD conversion, the demodulator circuit which has been required in the prior art becomes unnecessary. Thus, as compared with the prior art, the response speed can be further improved by the omission of the calculation of the demodulator circuit. Further, at the specific time of the sine wave for excitation of the resolver, the sine-wave output and cosine-wave output of the resolver are subjected to AD conversion, and the sine wave for excitation can be regarded as a constant. Thus, it is possible to eliminate an increase of an angle error due to a positional shift between the excitation sine wave and the sine-wave output and cosine-wave output of the resolver, and even if an interface cable between the resolver and the R/D converter becomes long, the angle error can be made small.

According to the fourth aspect of the invention, the angle of the VCO is made to correspond to the rotor shaft angle and it becomes possible to recognize the size relation between both. By increasing or decreasing an address of, for example, the VCO (sine-wave table) by 1 bit at a time according to the size relation of both, position setting (position judgement) with high precision can be made.

According to the fifth aspect of the invention, it becomes possible to increase or decrease the address of the VCO (sine-wave table) by 1 bit at a time according to the size relation between the angle of the VCO and the rotor shaft angle, and by this, position setting (position judgement) with high precision can be made.

According to the sixth aspect of the invention, when the rotor shaft angle of the resolver in a quadrant exists on the right side as compared with the angle of the VCO, the address value of the VCO (sine-wave table) is made to increment, so that the precision of position setting (position judgement) can be improved.

According to the seventh aspect of the invention, when the rotor shaft angle of the resolver in the quadrant exists on the left side as compared with the angle of the VCO, the address value of the VCO (sine-wave table) is made to decrement, so that the precision of position setting (position judgement) can be improved.

According to the eighth aspect of the invention, the AD conversion value of the sine-wave output of the resolver and the sin value of the angle of the VCO are compared with each other, the address of the VCO (sine-wave table) is increased or decreased by 1 bit at a time according to a quadrant of the rotor shaft angle, and an angle corresponding to the address of the VCO (sine-wave table) is made to approach the rotor shaft angle. Accordingly, the precision of position setting (position judgement) can be improved.

According to the ninth aspect of the invention, the rotor angle displacement $\Delta\theta$ is calculated from the AD conversion values of the sine-wave output and cosine-wave output of the resolver and the sin value and cos value of the angle of the VCO, and the address corresponding to the angle of the VCO is jumped by the jump amount expressed by $\Delta\theta/K$, so that the calculation speed can be increased.

What is claimed is:

1. An R/D converter, comprising:

a digital signal processing processor to which data obtained through AD conversion of a sine-wave output and a cosine-wave output of a resolver are inputted, wherein the digital signal processing processor obtains a rotor shaft angle of the resolver through a digital operation on the basis of the digital input data; and wherein a quadrant formed by dividing an angular space of the resolver into four equal parts is obtained, the rotor shaft angle of the resolver in the quadrant is obtained on the basis of polarities of the sine-wave output and the cosine-wave output of the resolver, and an initial angle of a rotor shaft angle for calculating VCO is set at a center of each quadrant obtained by dividing into four equal parts.

2. An R/D converter as claimed in claim 1, wherein the digital signal processing processor inputs digital data for an excitation sine wave of the resolver to a DA converter, and the DA converter obtains the excitation sine wave of the resolver on the basis of the input data from the digital signal processing processor.

3. An R/D converter as claimed in claim 2, wherein at a specific phase time of the excitation sine wave of the resolver, a sine-wave output signal and a cosine-wave output signal of the resolver are subjected to AD conversion, and the rotor shaft angle of the resolver is calculated.

4. An R/D converter as claimed in claim 1, wherein a sin value corresponding to a difference between the rotor shaft angle of the resolver and an angle corresponding to an address of a sine-wave table is calculated, and an angel of the VCO is increased or decreased on the basis of size relation between the rotor shaft angle of the resolver and the angle of the VCO.

5. An R/D converter as claimed in claim 4, wherein the quadrant is set such that a value in the angular space becomes large from the left to the right, and in the quadrant, if the rotor shaft angle of the resolver exists on the right side as compared with the angle of the VCO, the angle of the VCO is made to increment.

6. An R/D converter as claimed in claim 4, wherein the quadrant is set such that a value in the angular space becomes large from the left to the right, and in the quadrant, if the rotor shaft angle of the resolver exists on the left side as compared with the angle of the VCO, the angle of the VCO is made to decrement.

7. An R/D converter as claimed in claim 4, wherein an AD conversion value of the sine-wave output of the resolver and a sin value of the angle of the VCO are compared with each other, an address corresponding to an angle of the sine-wave table is increased or decreased by one bit at a time according to the rotor shaft angle in the quadrant, and an angle corresponding to the address is made to approach the rotor shaft angle.

8. An R/D converter as claimed in claim 4, wherein a rotor angle displacements $\Delta\theta$ is calculated from AD conversion values of the sine-wave output and the cosine-wave output of the resolver and a sin value and a cos value of the angle of the VCO, and an address corresponding to the angle of the VCO is jumped by a jump amount expressed by $\Delta\theta/K$.

* * * * *